(12) United States Patent
Greenlee et al.

(10) Patent No.: US 12,322,443 B2
(45) Date of Patent: Jun. 3, 2025

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Jordan D. Greenlee, Boise, ID (US); David Ross Economy, Boise, ID (US); John D. Hopkins, Meridian, ID (US); Nancy M. Lomeli, Boise, ID (US); Jiewei Chen, Meridian, ID (US); Rita J. Klein, Boise, ID (US); Everett A. McTeer, Eagle, ID (US); Aaron P. Thurber, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 463 days.

(21) Appl. No.: 17/851,865

(22) Filed: Jun. 28, 2022

(65) Prior Publication Data
US 2023/0395149 A1 Dec. 7, 2023

Related U.S. Application Data

(60) Provisional application No. 63/348,080, filed on Jun. 2, 2022.

(51) Int. Cl.
| | |
|---|---|
| *H10B 41/10* | (2023.01) |
| *G11C 16/04* | (2006.01) |
| *H10B 41/27* | (2023.01) |
| *H10B 41/35* | (2023.01) |
| *H10B 43/10* | (2023.01) |

(Continued)

(52) U.S. Cl.
CPC ......... *G11C 16/0483* (2013.01); *H10B 41/10* (2023.02); *H10B 41/27* (2023.02);
(Continued)

(58) Field of Classification Search
CPC .... G11C 16/0483; H10B 41/10; H10B 41/27; H10B 43/10; H10B 43/27
(Continued)

(56) References Cited

U.S. PATENT DOCUMENTS

| | | |
|---|---|---|
| 10,236,301 B1 | 3/2019 | Howder et al. |
| 11,362,142 B2 | 6/2022 | Hu |

(Continued)

OTHER PUBLICATIONS

Chen et al., U.S. Appl. No. 17/674,478, filed Feb. 17, 2022, titled "Methods Used In Forming A Memory Array Comprising Strings Of Memory Cells", 37 pages.
(Continued)

*Primary Examiner* — Hoai V Pham
(74) *Attorney, Agent, or Firm* — Wells St. John P.S.

(57) ABSTRACT

A method used in forming a memory array comprising strings of memory cells comprises forming memory block regions individually comprising a vertical stack comprising alternating insulative tiers and conductive tiers. Channel-material strings extend through the insulative tiers and the conductive tiers. The conductive tiers individually comprise a void-space extending laterally-across individual of the memory-block regions. At least one of conductive or semi-conductive material is formed in the void-space laterally-outward of individual of the channel-material strings. Conductive molybdenum-containing metal material is formed in the void-space directly against the at least one of the conductive or the semiconductive material and a conductive line comprising the conductive molybdenum-containing metal material is formed therefrom. The at least one of the conductive or the semiconductive material is of different composition from that of the conductive molybdenum-containing metal material. Other embodiments, including structure independent of method, are disclosed.

41 Claims, 8 Drawing Sheets

(51) Int. Cl.
   *H10B 43/27*  (2023.01)
   *H10B 43/35*  (2023.01)
(52) U.S. Cl.
   CPC ............. *H10B 41/35* (2023.02); *H10B 43/10* (2023.02); *H10B 43/27* (2023.02); *H10B 43/35* (2023.02)
(58) Field of Classification Search
   USPC .......................................... 257/314; 438/266
   See application file for complete search history.

(56) References Cited

U.S. PATENT DOCUMENTS

| | | |
|---|---|---|
| 2016/0218059 A1 | 6/2016 | Nakada et al. |
| 2020/0083059 A1 | 3/2020 | Hopkins et al. |
| 2020/0343258 A1 | 10/2020 | Otsu et al. |
| 2021/0183883 A1* | 6/2021 | Zhang ............... H01L 29/40117 |
| 2021/0280595 A1 | 9/2021 | Hopkins et al. |
| 2021/0280691 A1 | 9/2021 | Hopkins |
| 2022/0270967 A1 | 8/2022 | Hosoda et al. |
| 2023/0005942 A1 | 1/2023 | Hwang et al. |
| 2023/0157023 A1 | 5/2023 | Son et al. |

OTHER PUBLICATIONS

Greenlee et al., U.S. Appl. No. 17/689,527, filed Mar. 8, 2022, titled "Methods Used In Forming A Memory Array Comprising Strings Of Memory Cells And Memory Arrays Comprising Strings Of Memory Cells", 43 pages.

* cited by examiner

MEMORY ARRAYS COMPRISING STRINGS OF MEMORY CELLS AND METHODS USED IN FORMING A MEMORY ARRAY COMPRISING STRINGS OF MEMORY CELLS

RELATED PATENT DATA

This application claims priority to U.S. Provisional Patent Application Ser. No. 63/348,080, filed Jun. 2, 2022, entitled "Memory Arrays Comprising Strings Of Memory Cells And Methods Used In Forming A Memory Array Comprising Strings Of Memory Cells", naming Jordan D. Greenlee, David Ross Economy, John D. Hopkins, Nancy M. Lomeli, Jiewei Chen, Rita J. Klein, Everett A. McTeer, and Aaron P. Thurber as inventors, the disclosure of which is incorporated by reference.

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
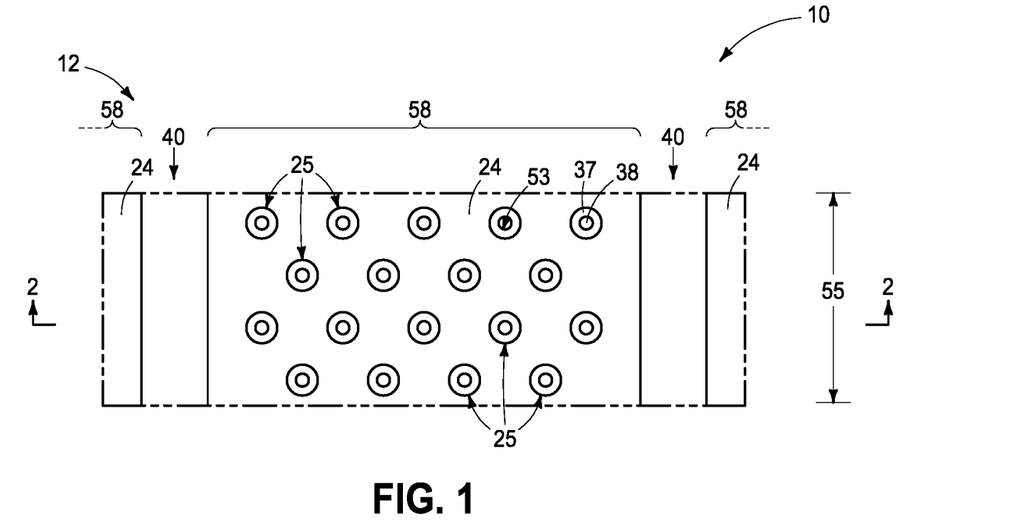
FIGS. 1-4 are diagrammatic cross-sectional views of portions of a construction that will comprise an array of elevationally-extending strings of memory cells in accordance with an embodiment of the invention.
Figure 2:
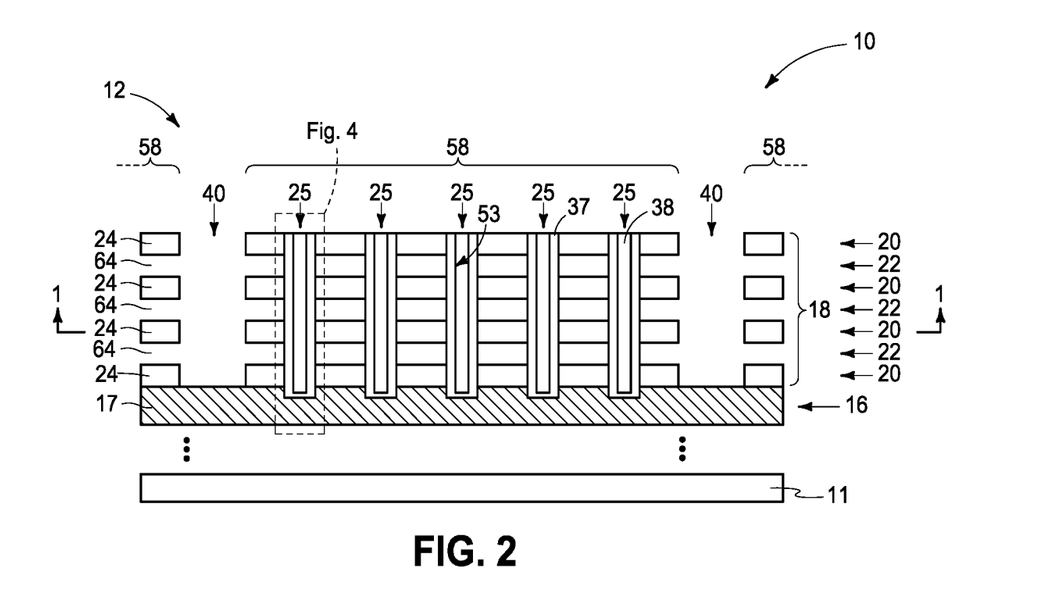
Figure 3:
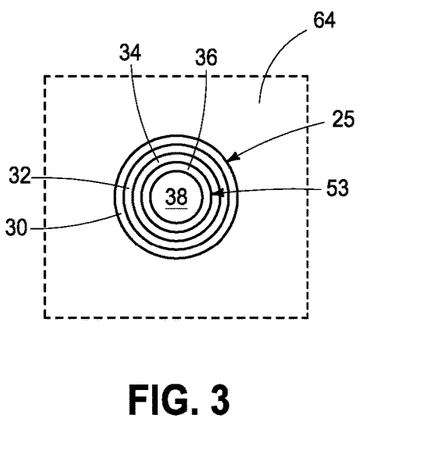
Figure 4:
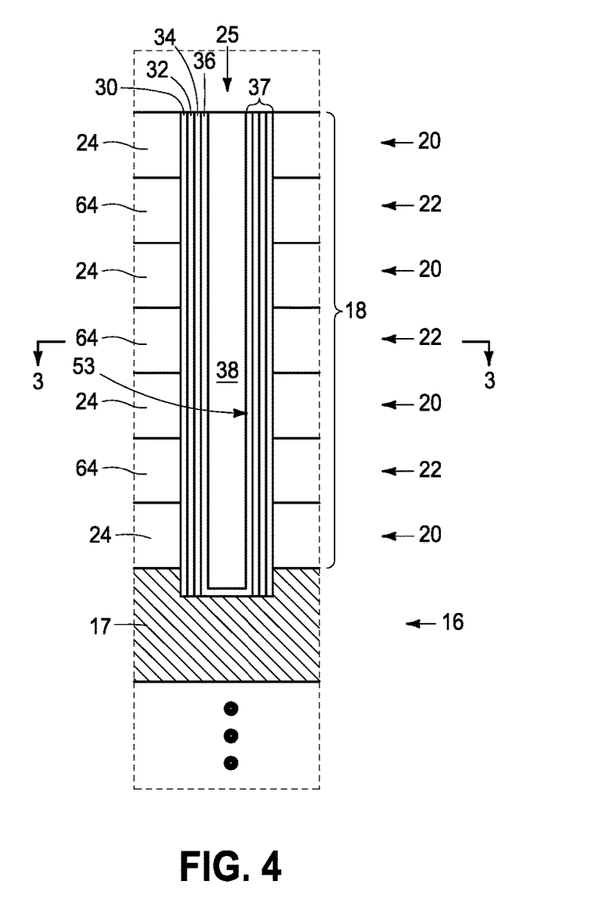
Figure 5:
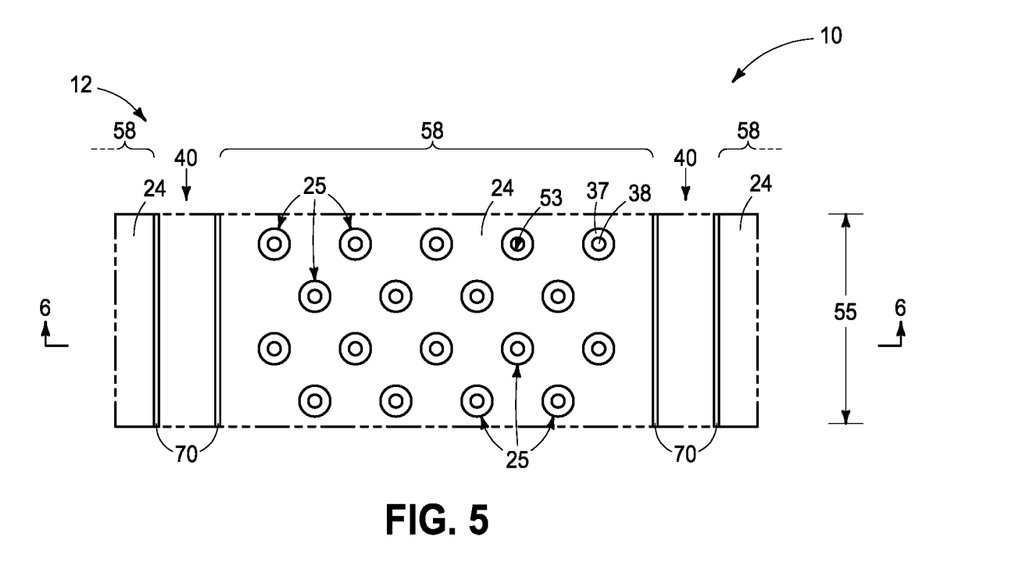
FIGS. 5-17 are diagrammatic sequential sectional and/or enlarged views of the construction of FIGS. 1-4, or portions thereof or alternate and/or additional embodiments, in process in accordance with some embodiments of the invention.
Figure 6:
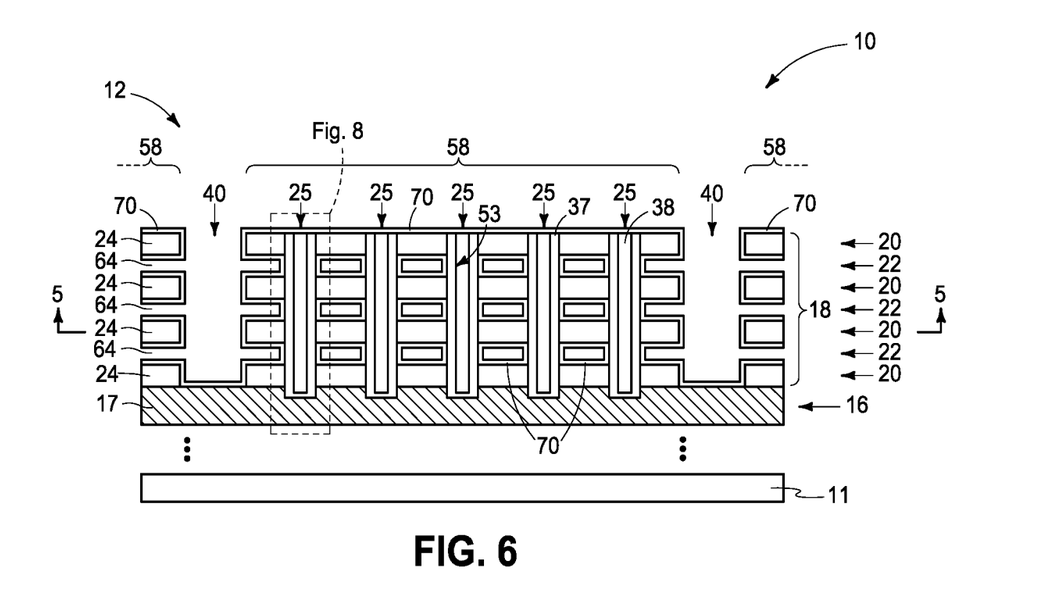
Figure 7:
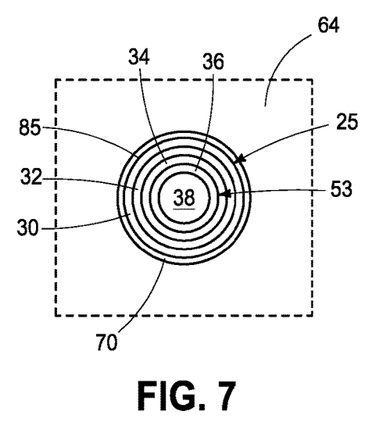
Figure 8:
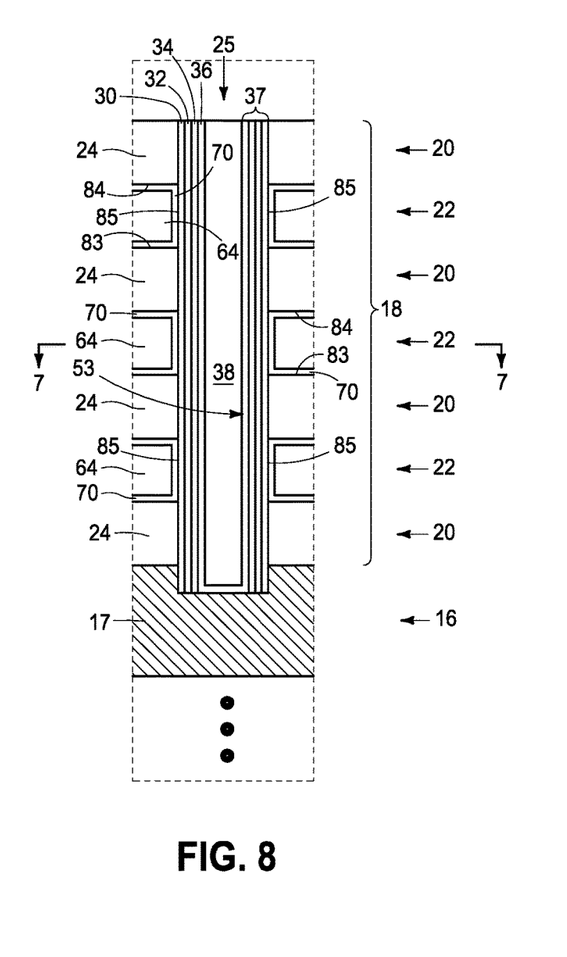
Figure 9:
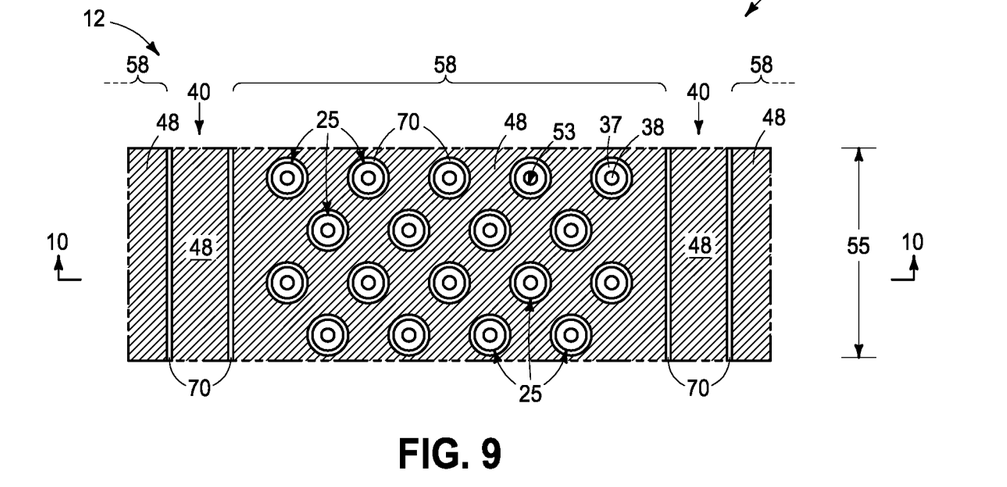
Figure 10:
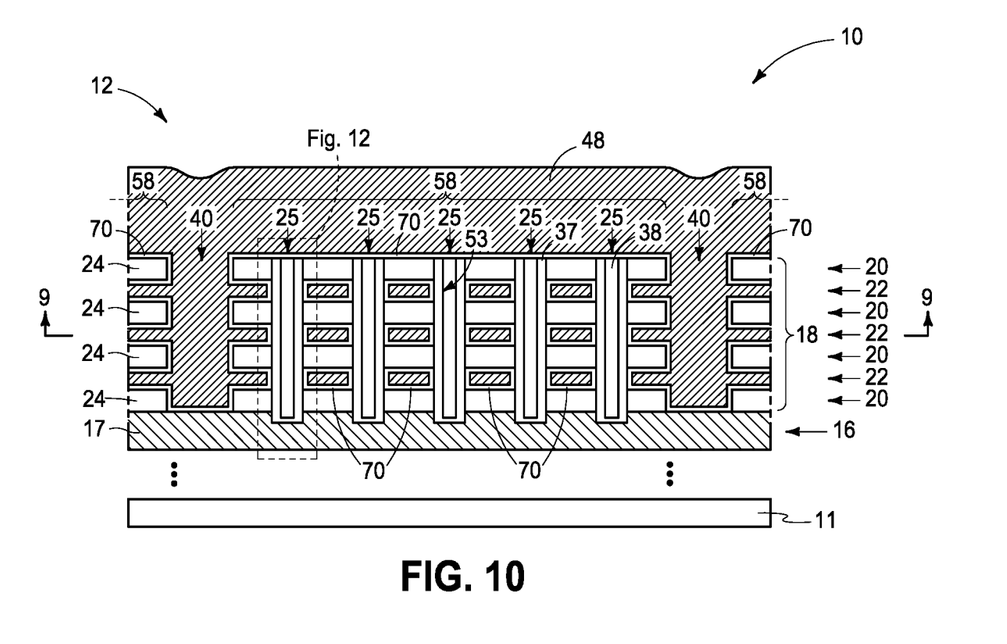
Figure 11:
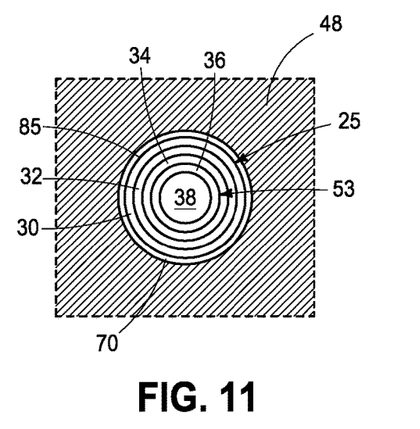
Figure 12:
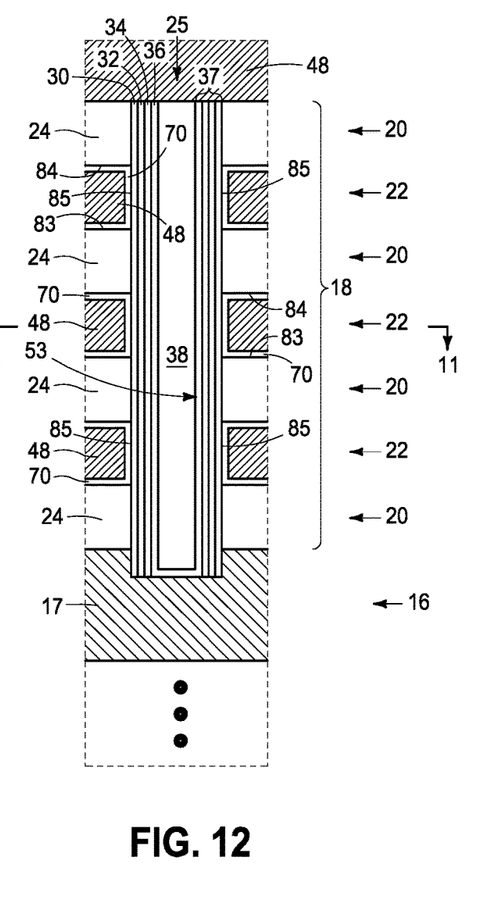
Figure 13:
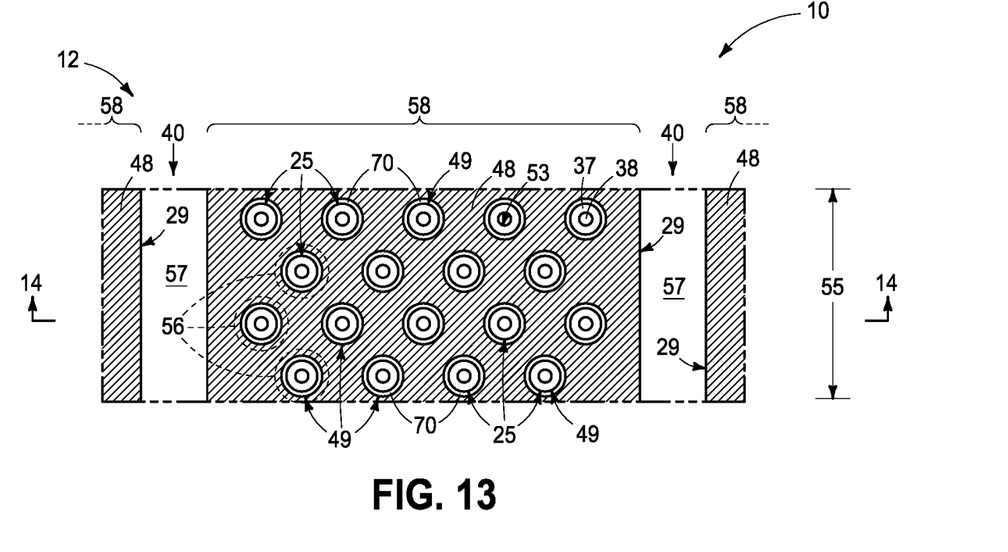
Figure 14:
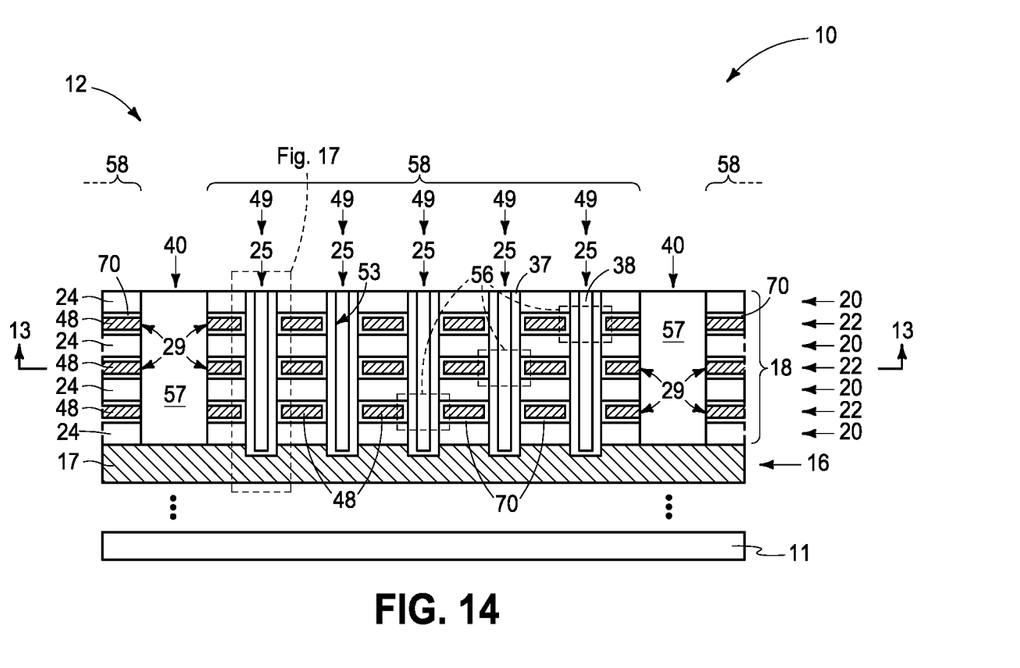
Figure 15:
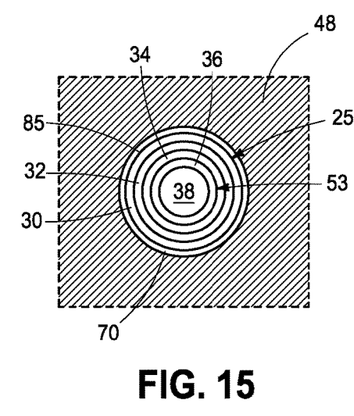
Figure 16:
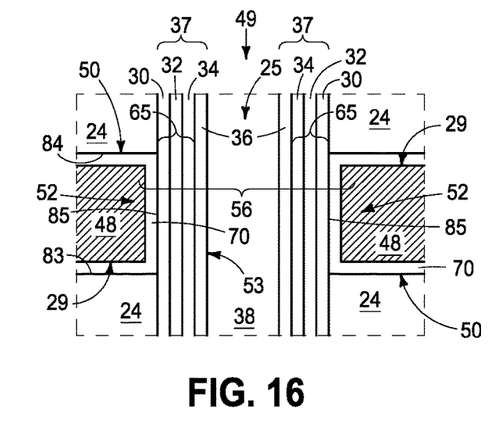
Figure 17:
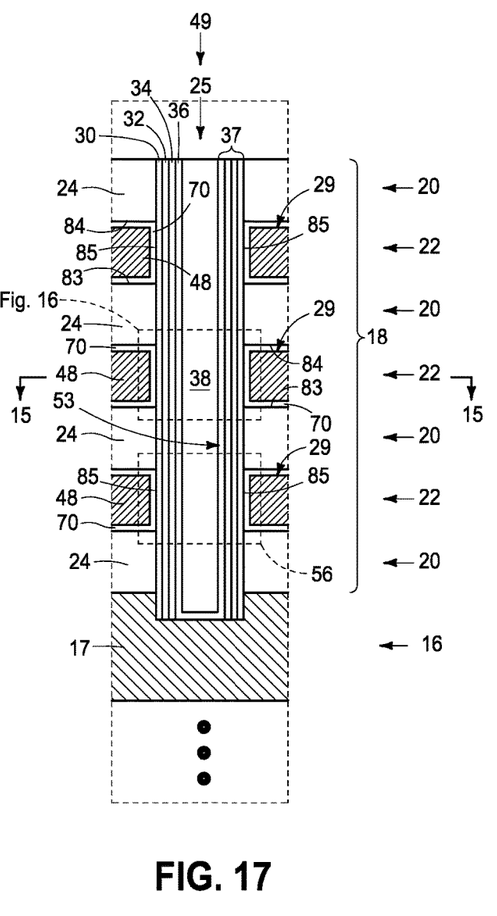

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry comprising a memory array comprising strings of memory cells (e.g., NAND architecture) independent of method of manufacture. First example method embodiments are described with reference to FIGS. 1-17.

FIGS. 1-4 show an example construction 10 having an array 12 in which elevationally-extending strings of transistors and/or memory cells will be formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-4-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., $WSi_x$ atop conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A vertical stack 18 comprising vertically-alternating insulative tiers 20 and conductive tiers 22 is directly above conductor tier 16. In some embodiments, conductive tiers 22 may be referred to as first tiers 22 and insulative tiers 20 are referred to as second tiers 20. Example thickness for each of tiers 20 and 22 is 20 to 60 nanometers. The example uppermost tier 20 may be thicker/thickest compared to one or more other tiers 20 and/or 22. Only a small number of tiers 20 and 22 is shown in FIGS. 1-4, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward and/or radially-outward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired and/or to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory block regions 58 that will comprise laterally-spaced memory blocks 58 in a finished circuitry construction. In this document, "block" is generic to include "sub-block". Memory block regions 58 and resultant memory blocks 58 (not yet shown) may be considered as being longitudinally elongated and oriented, for example along a first direction 55. Any alternate existing or future-developed arrangement and construction may be used.

Example memory block regions 58 are shown as at least in part having been defined by horizontally-elongated trenches 40 that were formed (e.g., by anisotropic etching) into stack 18 (e.g., trenches 40 being between immediately-laterally-adjacent memory block regions 58). Trenches 40 will typically be wider than channel openings 25 (e.g., 3 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown). Trenches 40 may taper laterally inward and/or outward in vertical cross-section (not shown).

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

The figures show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (operative channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled with conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Conductive tiers 22 individually comprise a void-space 64 extending laterally-across individual of memory-block regions 58. In an example gate-last process, such may be formed by forming first/conductive tiers 22 to initially comprise a sacrificial material (not shown; e.g., silicon nitride when material 24 comprises silicon dioxide). Such sacrificial material is then isotropically etched away selectively relative to material 24 of second/insulative tiers 20 through trenches 40, thus leaving void-space 64 therebehind.

Referring to FIGS. 5-8, at least one of conductive or semiconductive material 70 has been formed in void-space 64 laterally-outward of individual channel-material strings 53. In one such embodiment and as shown, a floor 83, a ceiling 84, and a sidewall 85 (e.g., of material 30) of void-space 64 have been lined with at least one of conductive or semiconductive material 70 laterally-outward of individual channel-material strings 53. Alternately, material 70 may only be against sidewall 85 (not shown). A thin insulative liner (e.g., $Al_2O_3$ and not shown) may be formed before forming material 70. In one embodiment, the at least one of the conductive or the semiconductive material 70 is deposited to a maximum thickness of no greater than 10 Angstroms and in one such embodiment to a maximum thickness of no greater than 6 Angstroms. In one embodiment, the at least one of the conductive or the semiconductive material 70 comprises conductive material (e.g., at least one of a conductive metal nitride, W, WN, WOx, WOxNy, Ti, TiN, Co, CoN, Ru, RuN, and conductively-doped polysilicon). In one embodiment, the at least one of the conductive or the semiconductive material 70 comprises semiconductive material (e.g., at least one of MN and undoped or semiconductively-doped polysilicon).

Referring to FIGS. 9-12, conductive molybdenum-containing metal material 48 has been formed in void-space 64 directly against the at least one of the conductive or the semiconductive material 70 (e.g., material 48 comprising elemental molybdenum, a conductive alloy containing molybdenum, and/or a conductive metal compound containing molybdenum; in one embodiment consisting essentially of elemental molybdenum). The at least one of the conductive or the semiconductive material 70 is of different composition from that of conductive molybdenum-containing metal material 48. In one embodiment, and as shown, conductive molybdenum-containing metal material 48 is at least initially formed to overfill remaining volume of void-space 64.

FIGS. 13-17 show subsequent example processing wherein materials 48 and 70 have been removed from trenches 40, thereby forming individual conductive lines 29 (e.g., wordlines) comprising conductive molybdenum-containing metal material 48 and elevationally-extending strings 49 of individual transistors and/or memory cells 56. Regardless, in one embodiment, the at least one of the conductive or the semiconductive material 70 is continuous from a top of conductive line 29 to a bottom of conductive line 29 in a vertical cross-section (e.g., that of FIGS. 14, 16, 17) and in one such embodiment is continuous along floor 83, ceiling 84, and sidewall 85 of void-space 64.

Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conductive molybdenum-containing metal material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conductive molybdenum-containing metal material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conductive molybdenum-containing metal material 48). Regardless, as an additional example, an interface of a storage material and conductive material of a control gate may be sufficient to function as a charge-blocking region in the absence of any separate-composition-insulator material 30. Further, an interface of conductive molybdenum-containing metal material 48 with a semiconductive material 70 in combination with a semiconductive material 70 (and/or of a semiconductive 70 with material 30 (when present) in combination with insulator material 30) may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Intervening material 57 may include through array vias (not shown).

Any other attribute(s) or aspect(s) as shown and/or described herein with respect to other embodiments may be used in the embodiments shown and described with reference to the above embodiments.

Using a conductive and/or semiconductive material 70 in combination with a conductive molybdenum-containing metal material 48 may increase the range between program and erase voltages as compared to using conductive molybdenum-containing metal material 48 in the absence of a conductive and/or semiconductive material 70.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises memory blocks (e.g., 58) individually comprising a vertical stack (e.g., 18) comprising alternating insulative tiers (e.g., 20) and conductive tiers (e.g., 22). Channel-material strings (e.g., 53) of memory cells extend through the insulative tiers and the conductive tiers. Individual of the conductive tiers comprise a conductive line (e.g., 29) comprising conductive molybdenum-containing metal material (e.g., 48). The individual conductive tiers comprise at least one of conductive or semiconductive material (e.g., 70) laterally-between the conductive molybdenum-containing metal material and individual of the channel-material strings. The at least one of the conductive or the semiconductive material is directly against the conductive molybdenum-containing metal material. The at least one of the conductive or the semiconductive material is of different composition from that of the conductive molybdenum-containing metal material. Any other attribute(s) or aspect(s) as shown and/or described herein with respect to other embodiments may be used.

In one embodiment, a memory array (e.g., 12) comprising strings (e.g., 49) of memory cells (e.g., 56) comprises strings (e.g., 49) of memory cells (e.g., 56) comprises memory blocks (e.g., 58) individually comprising a vertical stack (e.g., 18) comprising alternating insulative tiers (e.g., 20) and conductive tiers (e.g., 22). Channel-material strings (e.g., 53) of memory cells extend through the insulative tiers and the conductive tiers. Individual of the conductive tiers comprise a conductive line (e.g., 29) comprising conductive molybdenum-containing metal material (e.g., 48). The individual conductive tiers comprise at least one of conductive or semiconductive material (e.g., 70) directly above, directly below, and laterally-between the conductive molybdenum-containing metal material and individual of the channel-material strings. The at least one of the conductive or the semiconductive material is directly against the conductive molybdenum-containing metal material of the conductive line. The at least one of the conductive or the semiconductive material is of different composition from that of the conductive molybdenum-containing metal material. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming memory block regions individually comprising a vertical stack comprising alternating insulative tiers and conductive tiers. Channel-material strings extend through the insulative tiers and the conductive tiers. The conductive tiers individually comprise a void-space extending laterally-across individual of the memory-block regions. At least one of conductive or semiconductive material is formed in the void-space laterally-outward of individual of the channel-material strings. Conductive molybdenum-containing metal material is formed in the void-space directly against the at least one of the conductive or the semiconductive material and a conductive line comprising the conductive molybdenum-containing metal material is formed therefrom. The at least one of the conductive or the semiconductive material is of different composition from that of the conductive molybdenum-containing metal material.

In some embodiments, a method used in forming a memory array comprising strings of memory cells comprises forming memory block regions individually comprising a vertical stack comprising alternating insulative tiers and conductive tiers. Channel-material strings extend through the insulative tiers and the conductive tiers. The conductive tiers individually comprise a void-space extending laterally-across individual of the memory-block regions. A floor, a ceiling, and a sidewall of the void-space are lined with at least one of conductive or semiconductive material laterally-outward of individual of the channel-material strings. Conductive molybdenum-containing metal material is formed within the void-space directly against the at least one of the conductive or the semiconductive material and a conductive line comprising the conductive molybdenum-containing metal material is formed therefrom. The at least one of the conductive or the semiconductive material is of different composition from that of the conductive molybdenum-containing metal material.

In some embodiments, a memory array comprising strings of memory cells comprises memory blocks individually comprising a vertical stack comprising alternating insulative tiers and conductive tiers. Channel-material strings of memory cells extend through the insulative tiers and the conductive tiers. Individual of the conductive tiers comprises a conductive line comprising conductive molybdenum-containing metal material. The individual conductive tiers comprise at least one of conductive or semiconductive material laterally-between the conductive molybdenum-containing metal material and individual of the channel-material strings. The at least one of the conductive or the semiconductive material is directly against the conductive molybdenum-containing metal material. The at least one of the conductive or the semiconductive material is of different composition from that of the conductive molybdenum-containing metal material.

In some embodiments, a memory array comprising strings of memory cells comprises memory blocks individually comprising a vertical stack comprising alternating insulative tiers and conductive tiers. Channel-material strings of memory cells extend through the insulative tiers and the conductive tiers. Individual of the conductive tiers comprise a conductive line comprising conductive molybdenum-containing metal material. The individual conductive tiers comprise at least one of conductive or semiconductive material directly above, directly below, and laterally-between the conductive molybdenum-containing metal material and individual of the channel-material strings. The at least one of the conductive or the semiconductive material is directly against the conductive molybdenum-containing metal material of the conductive line. The at least one of the conductive or the semiconductive material is of different composition from that of the conductive molybdenum-containing metal material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming memory block regions individually comprising a vertical stack comprising alternating insulative tiers and conductive tiers, channel-material strings extending through the insulative tiers and the conductive tiers, the conductive tiers individually comprising a void-space extending laterally-across individual of the memory-block regions;
    forming at least one of conductive or semiconductive material in the void-space laterally-outward of individual of the channel-material strings; and
    forming conductive molybdenum-containing metal material in the void-space directly against the at least one of the conductive or the semiconductive material and forming therefrom a conductive line comprising the conductive molybdenum-containing metal material, the at least one of the conductive or the semiconductive material being of different composition from that of the conductive molybdenum-containing metal material.

2. The method of claim 1 wherein the conductive molybdenum-containing metal material consists essentially of elemental molybdenum.

3. The method of claim 1 wherein the conductive molybdenum-containing metal material is at least initially formed to overfill remaining volume of the void-space.

4. The method of claim 1 wherein the at least one comprises the conductive material.

5. The method of claim 4 wherein the conductive material comprises at least one of a conductive metal nitride, W, WN, $WO_x$, $WO_xN_y$, Ti, TiN, Co, CON, Ru, RuN, and conductively-doped polysilicon.

6. The method of claim 5 wherein the conductive material comprises TiN.

7. The method of claim 6 wherein the TiN is deposited to a maximum thickness no greater than 10 Angstroms.

8. The method of claim 1 wherein the at least one comprises the semiconductive material.

9. The method of claim 8 wherein the semiconductive material comprises at least one of AlN, undoped polysilicon, and semiconductively-doped polysilicon.

10. The method of claim 1 wherein the at least one comprises each of the conductive material and the semiconductive material.

11. The method of claim 1 wherein the at least one is continuous from a top of the conductive line to a bottom of the conductive line in a vertical cross-section.

12. The method of claim 1 wherein the at least one is deposited to a maximum thickness no greater than 10 Angstroms.

13. The method of claim 12 wherein the at least one is deposited to a maximum thickness no greater than 6 Angstroms.

14. A method used in forming a memory array comprising strings of memory cells, comprising:
    forming memory block regions individually comprising a vertical stack comprising alternating insulative tiers and conductive tiers, channel-material strings extending through the insulative tiers and the conductive tiers, the conductive tiers individually comprising a void-space extending laterally-across individual of the memory-block regions;
    lining a floor, a ceiling, and a sidewall of the void-space with at least one of conductive or semiconductive material laterally-outward of individual of the channel-material strings; and
    forming conductive molybdenum-containing metal material within the void-space directly against the at least one of the conductive or the semiconductive material and forming therefrom a conductive line comprising the conductive molybdenum-containing metal material, the at least one of the conductive or the semiconductive material being of different composition from that of the conductive molybdenum-containing metal material.

15. The method of claim 14 wherein the at least one in a vertical cross-section is continuous along the floor, the ceiling, and the sidewall of the void-space.

16. The method of claim 14 wherein the at least one is deposited to a maximum thickness no greater than 10 Angstroms.

17. The method of claim 16 wherein the at least one is deposited to a maximum thickness no greater than 6 Angstroms.

18. The method of claim 14 wherein the at least one comprises the conductive material.

19. The method of claim 18 wherein the conductive material comprises at least one of a conductive metal nitride, W, WN, WO$_x$, WO$_x$N$_y$, Ti, TiN, Co, CON, Ru, RuN, and conductively-doped polysilicon.

20. The method of claim 14 wherein the at least one comprises the semiconductive material.

21. The method of claim 20 wherein the semiconductive material comprises at least one of AlN, undoped polysilicon, and semiconductively-doped polysilicon.

22. The method of claim 14 wherein the at least one comprises each of the conductive material and the semiconductive material.

23. A memory array comprising strings of memory cells, comprising:
    memory blocks individually comprising a vertical stack comprising alternating insulative tiers and conductive tiers, channel-material strings of memory cells extending through the insulative tiers and the conductive tiers;
    individual of the conductive tiers comprising a conductive line comprising conductive molybdenum-containing metal material; and
    the individual conductive tiers comprising at least one of conductive or semiconductive material laterally-between the conductive molybdenum-containing metal material and individual of the channel-material strings, the at least one of the conductive or the semiconductive material being directly against the conductive molybdenum-containing metal material, the at least one of the conductive or the semiconductive material being of different composition from that of the conductive molybdenum-containing metal material.

24. The memory array of claim 23 wherein the conductive molybdenum-containing metal material consists essentially of elemental molybdenum.

25. The memory array of claim 23 wherein the at least one comprises the conductive material.

26. The memory array of claim 25 wherein the conductive material comprises at least one of a conductive metal nitride, W, WN, WOx, WOxNy, Ti, TIN, Co, CON, Ru, RuN, and conductively-doped polysilicon.

27. The memory array of claim 26 wherein the conductive material comprises TiN.

28. The memory array of claim 27 wherein the TIN is deposited to a maximum thickness no greater than 10 Angstroms.

29. The memory array of claim 23 wherein the at least one comprises the semiconductive material.

30. The memory array of claim 29 wherein the semiconductive material comprises at least one of AlN, undoped polysilicon, and semiconductively-doped polysilicon.

31. The memory array of claim 23 wherein the at least one comprises each of the conductive material and the semiconductive material.

32. The memory array of claim 23 wherein the at least one is continuous from a top of the conductive line to a bottom of the conductive line in a vertical cross-section.

33. The memory array of claim 23 wherein the at least one is deposited to a maximum thickness no greater than 10 Angstroms.

34. The memory array of claim 33 wherein the at least one is deposited to a maximum thickness no greater than 6 Angstroms.

35. A memory array comprising strings of memory cells, comprising:
    memory blocks individually comprising a vertical stack comprising alternating insulative tiers and conductive tiers, channel-material strings of memory cells extending through the insulative tiers and the conductive tiers;
    individual of the conductive tiers comprising a conductive line comprising conductive molybdenum-containing metal material; and
    the individual conductive tiers comprising at least one of conductive or semiconductive material directly above, directly below, and laterally-between the conductive molybdenum-containing metal material and individual of the channel-material strings, the at least one of the conductive or the semiconductive material being directly against the conductive molybdenum-containing metal material of the conductive line, the at least one of the conductive or the semiconductive material being of different composition from that of the conductive molybdenum-containing metal material.

36. The memory array of claim 35 wherein the at least one in a vertical cross-section is continuous along a top, a bottom, and a side of the conductive molybdenum-containing metal material of the conductive line.

37. The memory array of claim 35 wherein the at least one comprises the conductive material.

38. The memory array of claim 37 wherein the conductive material comprises at least one of a conductive metal nitride, W, WN, WOx, WOxNy, Ti, TIN, Co, CON, Ru, RuN, and conductively-doped polysilicon.

39. The memory array of claim 35 wherein the at least one comprises the semiconductive material.

40. The memory array of claim 39 wherein the semiconductive material comprises at least one of AlN, undoped polysilicon, and semiconductively-doped polysilicon.

41. The memory array of claim 35 wherein the at least one comprises each of the conductive material and the semiconductive material.

\* \* \* \* \*